(12) United States Patent
Rolandi et al.

(10) Patent No.: US 6,525,961 B2
(45) Date of Patent: Feb. 25, 2003

(54) METHOD AND CIRCUIT FOR PROGRAMMING A MULTILEVEL NON-VOLATILE MEMORY

(75) Inventors: Paolo Rolandi, Voghera (IT); Massimo Montanaro, Pavia (IT); Giorgio Oddone, Rossiglione (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/952,957

(22) Filed: Sep. 12, 2001

(65) Prior Publication Data

US 2002/0071307 A1 Jun. 13, 2002

(30) Foreign Application Priority Data

Sep. 18, 2000 (EP) .............................................. 00830620

(51) Int. Cl.[7] .............................................. G11C 16/04
(52) U.S. Cl. ............................ 365/185.03; 365/185.18; 365/233
(58) Field of Search ....................... 365/185.03, 185.18, 365/233

(56) References Cited

U.S. PATENT DOCUMENTS

| | | | | |
|---|---|---|---|---|
| 5,959,883 A | * | 9/1999 | Brennan et al. | 365/185.03 |
| 6,178,118 B1 | * | 1/2001 | Lin et al. | 365/185.18 |
| 6,339,545 B2 | * | 1/2002 | Banks | 365/185.03 |

FOREIGN PATENT DOCUMENTS

| | | |
|---|---|---|
| FR | 2 632 110 A | 12/1989 |
| JP | 05133142 | 12/1994 |

* cited by examiner

*Primary Examiner*—Huan Hoang
(74) *Attorney, Agent, or Firm*—Jenkens & Gilchrist, P.C.

(57) ABSTRACT

A circuit and method for programming a multilevel non-volatile memory are disclosed. The circuit uses one or more address pins as one or more synchronization signals during a programming operation. The circuit includes a counter, controlled by the one or more address pins, for selecting a programming voltage to apply to an addressed memory cell. The circuit further includes compare circuitry for comparing the data value stored in the addressed memory cell with a desired data value. The counter is selectively incremented to apply a higher voltage for further programming of the addressed memory cell, based up the comparison.

26 Claims, 6 Drawing Sheets

METHOD AND CIRCUIT FOR PROGRAMMING A MULTILEVEL NON-VOLATILE MEMORY

BACKGROUND OF THE INVENTION

1. Technical Field of the Invention

The present invention generally relates to programming nonvolatile memory, and more specifically to a method and a circuit for programming a multilevel nonvolatile memory.

2. Description of Related Art

A memory chip is an electronic part which is used by a computer to store a program or data. There are two basic types of memory chips, volatile memory chips and nonvolatile memory chips. A nonvolatile memory chip, such as an EPROM or flash memory, does not lose its contents when power is switched off, while a volatile memory chips loses its contents when power is removed. It is known that most recent developments in the field of nonvolatile memories are directed towards increasing the storage capacities thereof.

Programming of a nonvolatile memory cell includes applying a potential difference between the drain and source of the floating gate transistor of the memory cell in the presence of a high potential difference being applied between the control gate and the source of the floating gate transistor. A known method used to program a multilevel nonvolatile memory utilizes a "voltage ladder" circuit, which is generated entirely inside the memory device. Moreover, in order to achieve effective programming, certain pins are dedicated for programming the memory cells. This limits the future expansion of the memory which generally requires an increasing number of address pins. Conventional memories use a chip enable pin Cen as a synchronization signal for the programming operation. However, the chip enable pin Cen may not be available in some nonvolatile memory devices for synchronizing programming operations.

In addition, the duration of time for programming the memory cells (i.e., the time for applying the programming voltages to a nonvolatile memory cell to the desired logic state) typically depends on complicated internal clock circuits whose delays are process dependent and varies considerably among individual devices.

Based upon the foregoing, there is a need for more effectively programming a multilevel nonvolatile memory device.

SUMMARY OF THE INVENTION

The present invention satisfies a significant need for more efficiently programming a multilevel nonvolatile memory. In accordance with an exemplary embodiment of the present invention, a multilevel nonvolatile memory is capable of being programmed without the use of dedicated programming pins. In addition, the memory does not require internal clock generation circuits to provide synchronization during a programming operation. Instead, the nonvolatile memory utilizes one or more address pins for providing synchronization during a programming operation.

A method of programming a nonvolatile memory cell according to the exemplary embodiment of the present invention may including comparing, using at least one address pin of the memory, a data value stored in an addressed nonvolatile memory cell to a desired data value, and applying, using the at least one address pin, program voltages to the addressed nonvolatile memory cell based upon the comparison.

BRIEF DESCRIPTION OF THE DRAWINGS

A more complete understanding of the method and circuit of the present invention may be obtained by reference to the following Detailed Description when taken in conjunction with the accompanying drawings wherein.

DETAILED DESCRIPTION OF THE PREFERRED EXEMPLARY EMBODIMENTS

The present invention will now be described more fully hereinafter with reference to the accompanying drawings in which an exemplary embodiment of the present invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
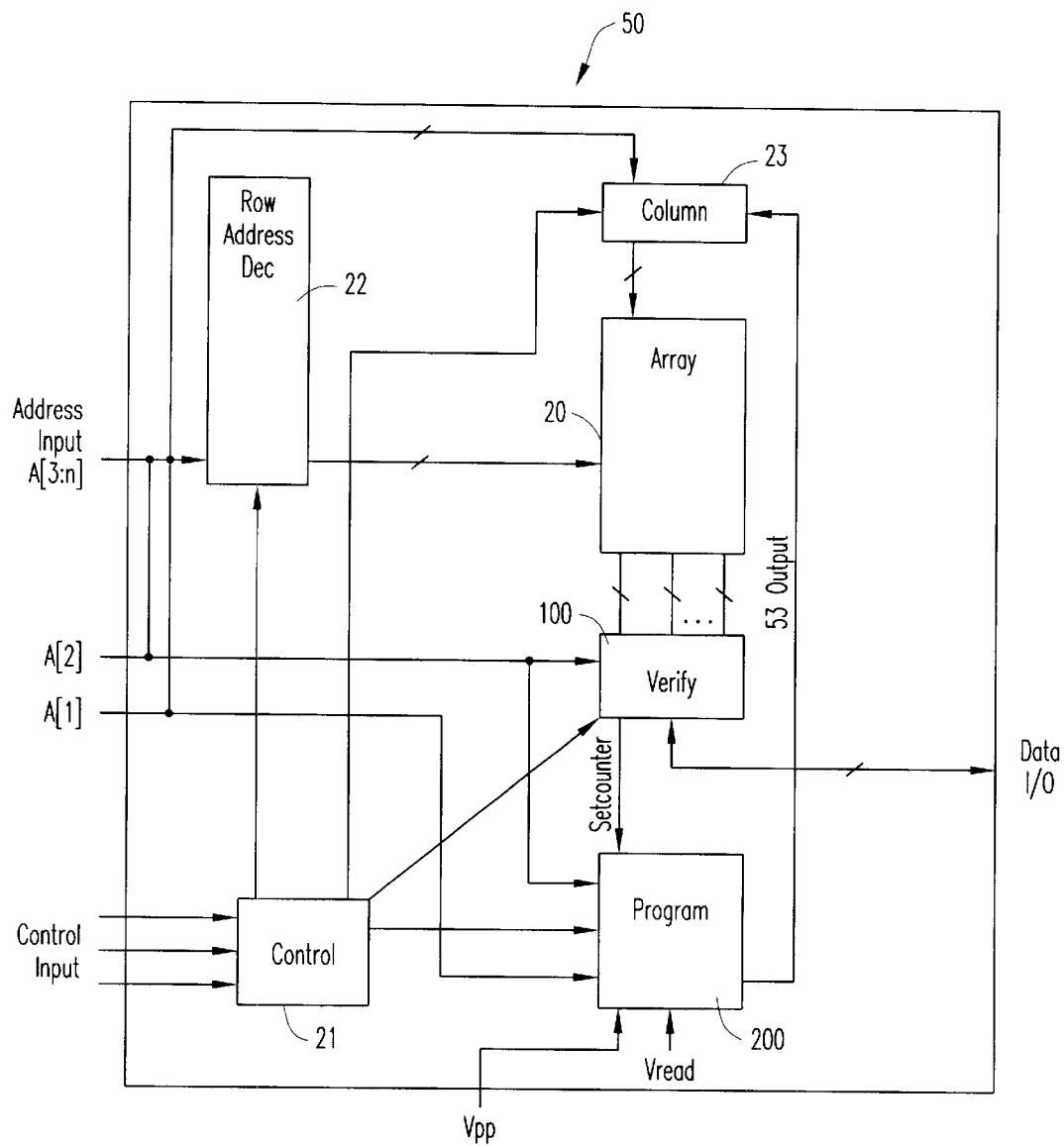
FIG. 1 is a block diagram of a multilevel nonvolatile memory device according to an exemplary embodiment of the present invention.

Referring to FIG. 1, there is illustrated a multilevel nonvolatile memory device 50 according to an exemplary embodiment of the present invention. The memory device 50 includes at least one array 20 of memory cells organized into rows and columns of memory cells. The memory device 50 may further include row decode circuitry 22 which receives an externally generated address or portion thereof and selects and/or activates a row of memory cells in array 20 corresponding to the externally generated address.

Memory device may further include column decode circuitry 23 which receives an externally generated address or portion thereof and selects one or more columns of memory cells corresponding to the externally generated address. Column decode circuitry 23 may, for example, be implemented as multiplexing circuitry for connecting addressed column lines (not shown) to circuitry external to array 20. In this way, the data contents of addressed memory cells, selected by row decode circuitry 22 and column decode circuitry 23, are selectively provided for subsequent amplification during a memory access operation.

Memory device 50 may additionally include control circuitry 21 for receiving externally generated, input control signals and generally controlling the various components of memory device 50 to perform memory access operations. Control circuitry 21 may providing timing and other control signals to various circuitry within memory device 50.

It is understood that the general use and operation of row and column decode circuitry in nonvolatile memory devices is known, so such circuitry will not be described in more detail for reasons of simplicity. It is further understood that memory device 50 may include other components or circuitry for performing memory access operations.

In addition, memory device 50 further includes blocks 100 and 200 demonstrating a verification circuit and programming circuit, respectively. Verification circuit 100 and programming circuit 200 are utilized for programming memory cells of array 20, as will be described in more detail below.

Figure 2:
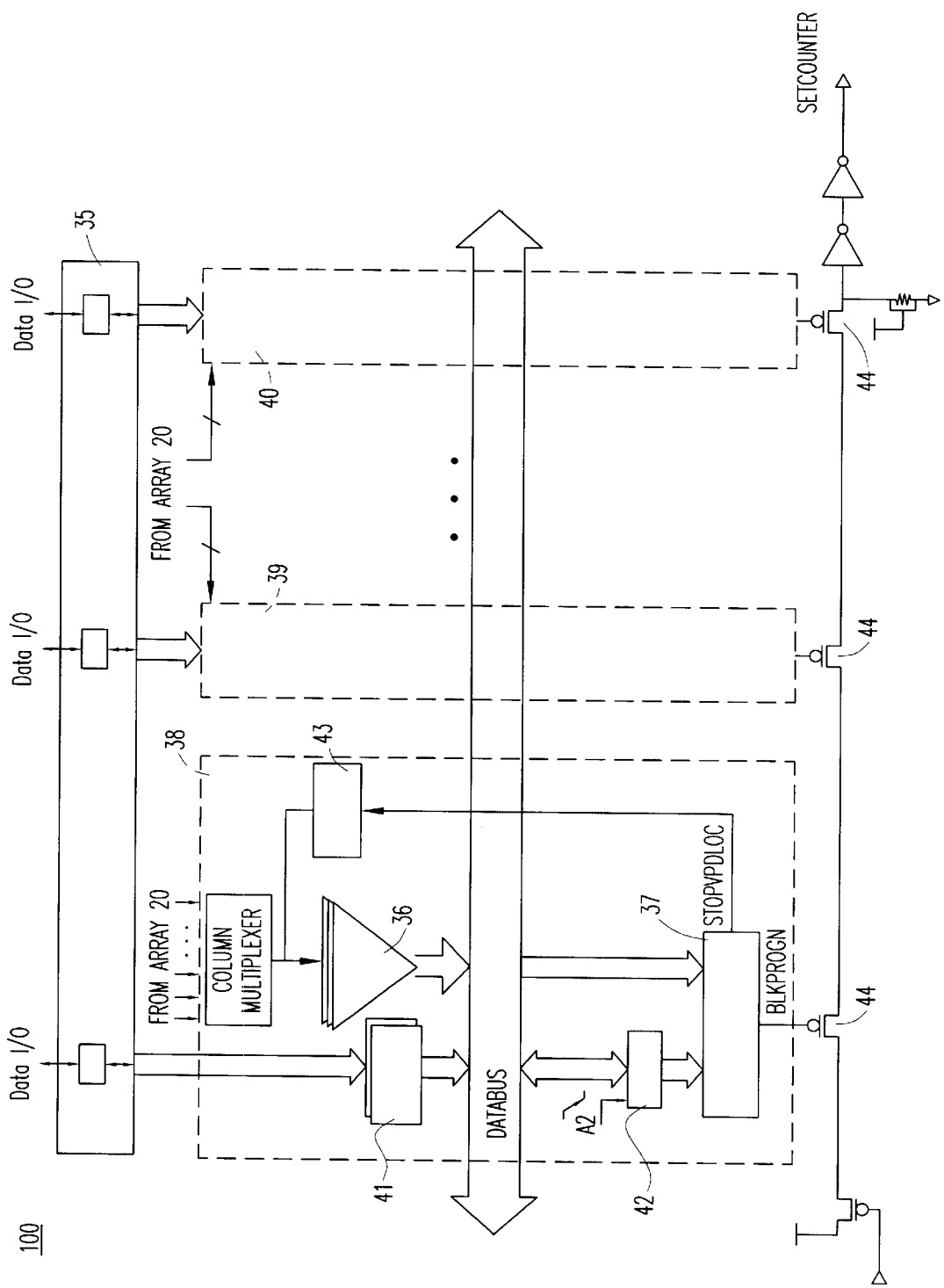
FIG. 2 is a block diagram of the architecture of an internal data bus and a verification circuit of the memory device of FIG. 1.

Referring to FIG. 2, there is illustrated a block diagram of an internal data bus architecture and verification circuit 100 of memory device 50. The verification circuit 100 comprises an internal data bus DATABUS used to store data to be programmed which arrives from the data output pads 35 of the memory device 50. The verification circuit 100 is divided into a plurality of blocks designated by numerals 38, 39 and 40. For clarity, block designated as 38 is described in detail, however, blocks 39 and 40 are substantially the same as block 38 and operate in parallel to program three addressed memory cells at a time. It is understood that although verification circuit 100 is illustrated in FIG. 2 as having only three blocks 38–40, verification circuit 100 may include any number of blocks in order to program any number of memory cells at a time.

Verification circuit 100 uses at least one and possibly two or more address pins for synchronizing programming operations. If two synchronization address pins are used, writing an entire array requires four consecutive sets of steps, with each set of steps used to program a quarter of the array 20 of memory cells. According to the exemplary embodiment of the present invention, each memory cell is capable of storing two bits of data (i.e., any one of four data levels). It is understood, however, that each memory cell may be capable of storing more than two bits of data.

Each block 38, 39 and 40 comprises circuitry to verify the data stored in an addressed memory cell. For each block 38–40, the data to be programmed arrives from the data output pads 35 of the memory and is stored temporarily at buffer 41. The data from buffer 41 is transferred to the DATABUS from there the data is sent to a memory element 42. The memory element 42 has an input, corresponding to the second address pin A2 (i.e., the address pin corresponding to the second most significant bit of the input address), used for synchronization. The output from memory element 42 is passed to comparison logic 37 which is responsible for comparing the data to be programmed with the data outputted from a sense amplifier 36 used in amplifying the data value stored in the addressed memory cell. The comparison logic 37 compares the two sets of data to determine if the desired programming results are achieved. Once programming has occurred and a comparison made, the comparison logic 37 sends a signal STOPVPDLOC to a voltage source 43 to discontinue the application of a high voltage to the sense amplifier 36. This removes the high voltage from the drain terminal of the memory cell and the corresponding addressed memory cell will not be further programmed as a result. Comparison logic 37 further generates a signal BLK-PROGN used to control the programming of addressed memory cells during a programming operation, as described in greater detail below.

Figure 3:
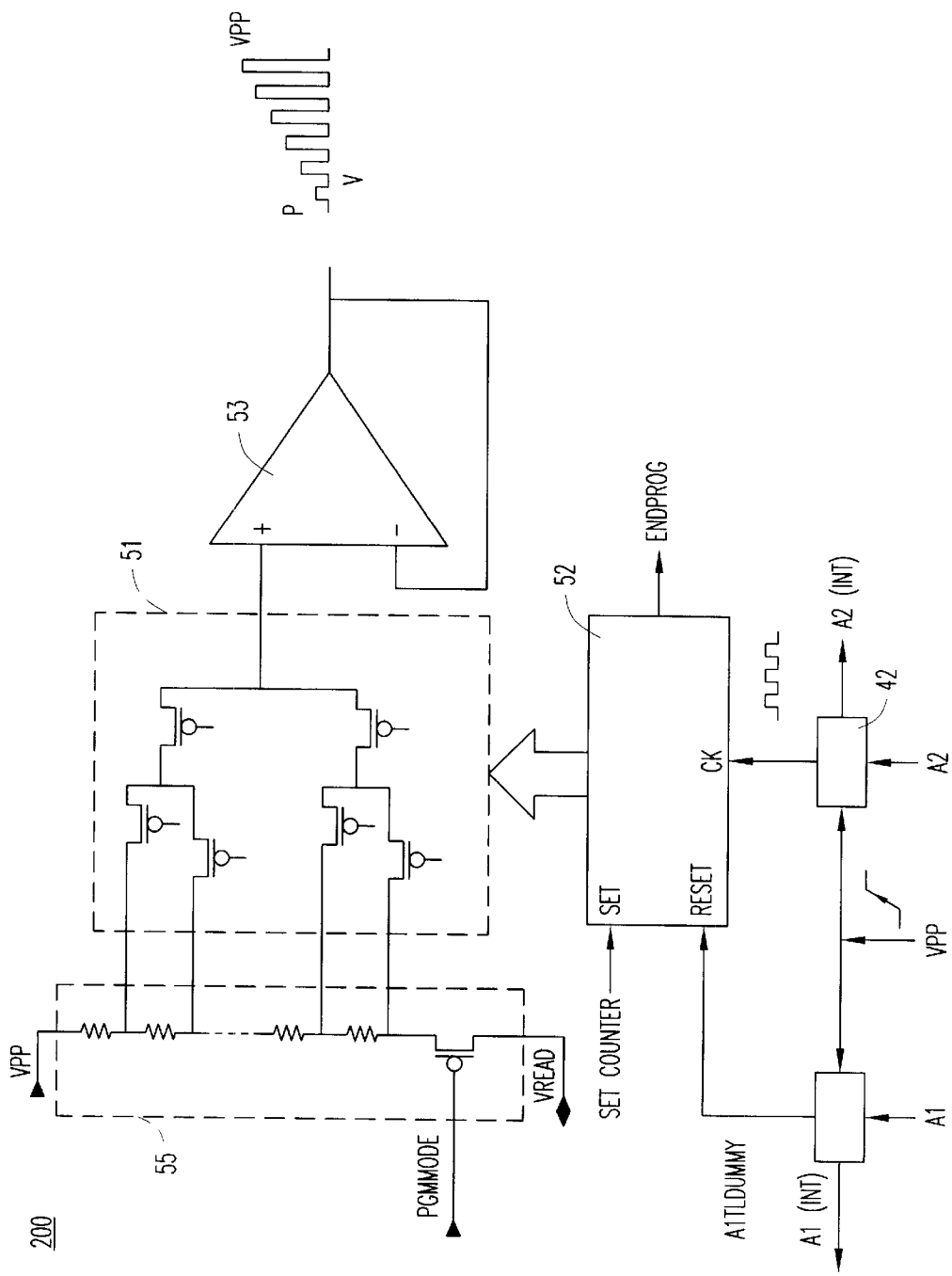
FIG. 3 is a block diagram of a programming circuit used of the memory device of FIG. 1.

Referring to FIG. 3, there is illustrated a block diagram of a programming circuit 200 for programming a memory cell in accordance with the memory device 50 of FIG. 1. To perform programming on each addressed memory cell, both an operational amplifier 53 (FIG. 3) and a voltage source 43 (FIG. 2) apply a high voltage to the gate and drain terminals, respectively, of an addressed memory cell. The ladder voltage required to program a multilevel memory cell is generated by a voltage divider 55 between a voltage Vpp and Vread which may be generated externally or internally relative to memory device 50. Decoding logic 51 selects the desired voltage level from voltage divider 55 to be sent to the gate terminal of the addressed memory cells to be programed, using operational amplifier 53. A counter 52 drives the decoding logic 51 and is controlled by two address pins A1 and A2. Address pins A1 and A2 may be the two most significant bits of the input address pins of memory device 50. During a programming operation, address pin A2 serves to increment counter 52 and address pin A1 selectively resets counter 52. The counter 52 stores the number of programming pulses or intervals to be applied to the addressed memory cells being programmed. The counter 52 selects the voltage level from voltage divider 50 to be applied to the gate terminal of an addressed memory cell. Counter 52 is capable of counting through all of the possible states in programming the addressed memory cells. However, if the signal SETCOUNTER (generated by verification circuit 100) is asserted, counter 52 is put in the all 1s state to provide an additional programming interval. The operation of counter 52 will be described in greater detail below.

Figure 4A:
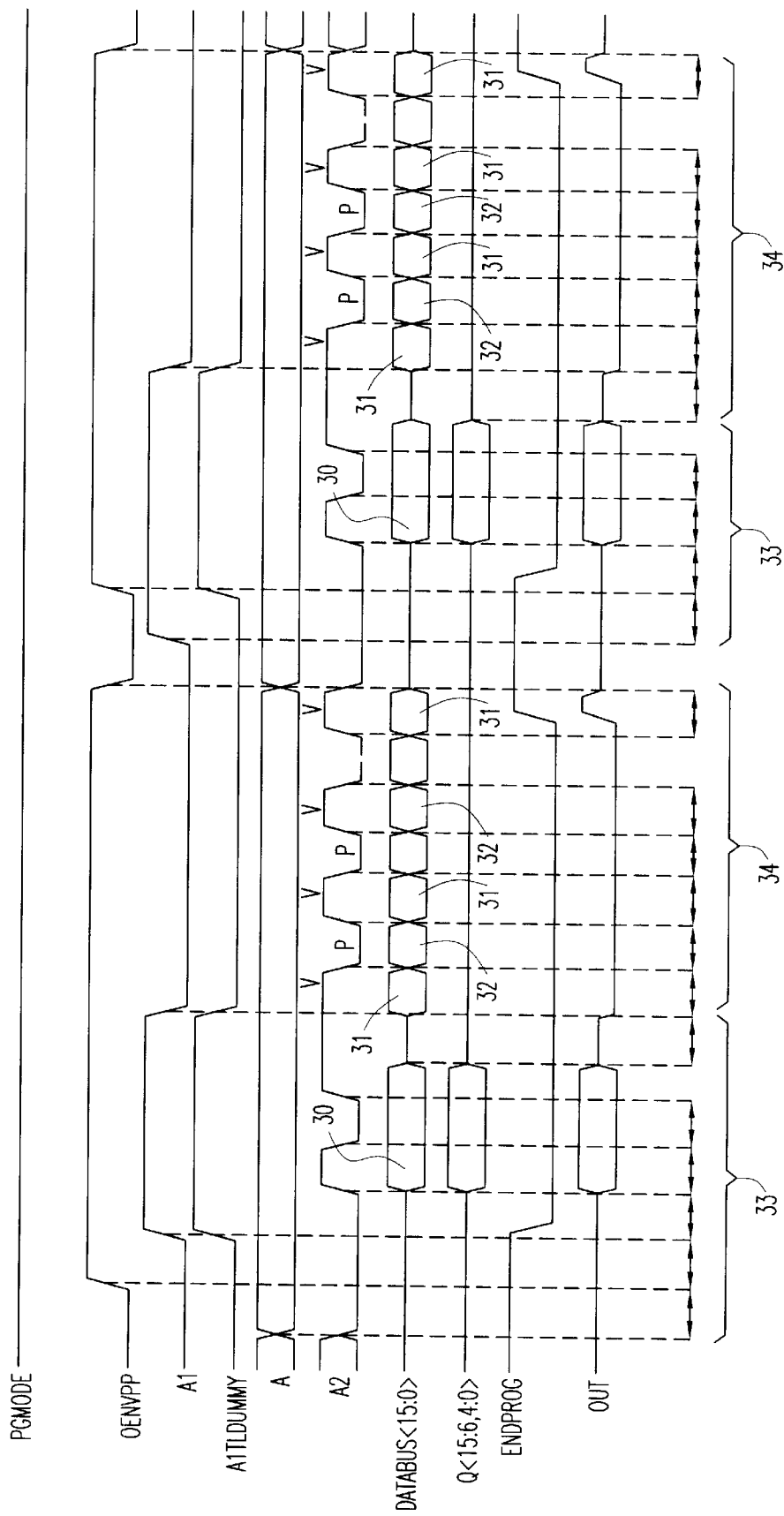
FIGS. 4a and 4b are timing diagrams of the external and internal signals of the memory device during a programming operation.
Figure 4B:
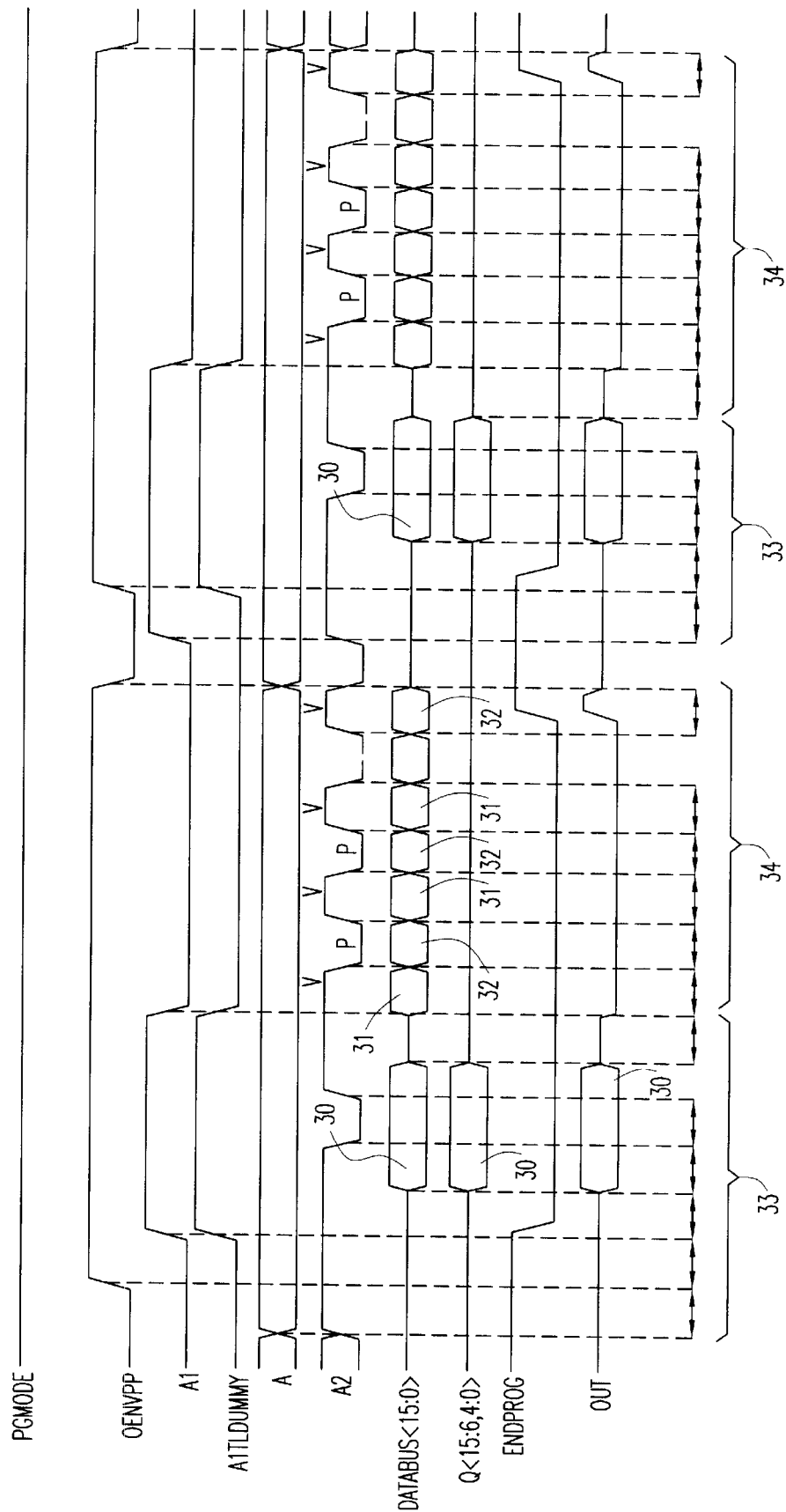

FIGS. 4a and 4b illustrate the timing diagrams of external and internal signals of the memory device during a programming operation. FIG. 4a illustrates the programming of a first and a second quarter of the memory array, while FIG. 4b does the same for the third and fourth quarter of the memory array. The quarters of array 20 are identified by address pins A1 and A2, as described below. The reference numeral 33 designates the preprogramming steps, while 34 designates the programming steps involved in programming the memory cell(s) in the specified quarter. The reference letter A refers to an address transition of all the addresses except A1 and A2, which correspond to the two address pins used as the write synchronization signals during a programming operation. The signal PGMODE sets the memory for programming. Reference numeral 30 refers to the step of loading data in a buffer 41, while 31 and 32 refer to reading data to be programmed and programming a memory cell, respectively. The signal ENDPROG indicates the end of programming and is outputted by counter 52 of FIG. 3. The reference letters V and P along the second address pin A2 indicates the verification and programming, respectively, of the programming operation. The verification and programming steps will be discussed in detail hereinafter with reference to FIG. 5.

The timing diagram of FIG. 4b is substantially similar to the timing diagram of FIG. 4a, except that address pin A2 is transitioned to the logic high state and then the logic low state during transit of the data on internal databus DATABUS. This allows programming of a different quarter of array 20 from the quarter programmed in FIG. 4a.

Figure 5:
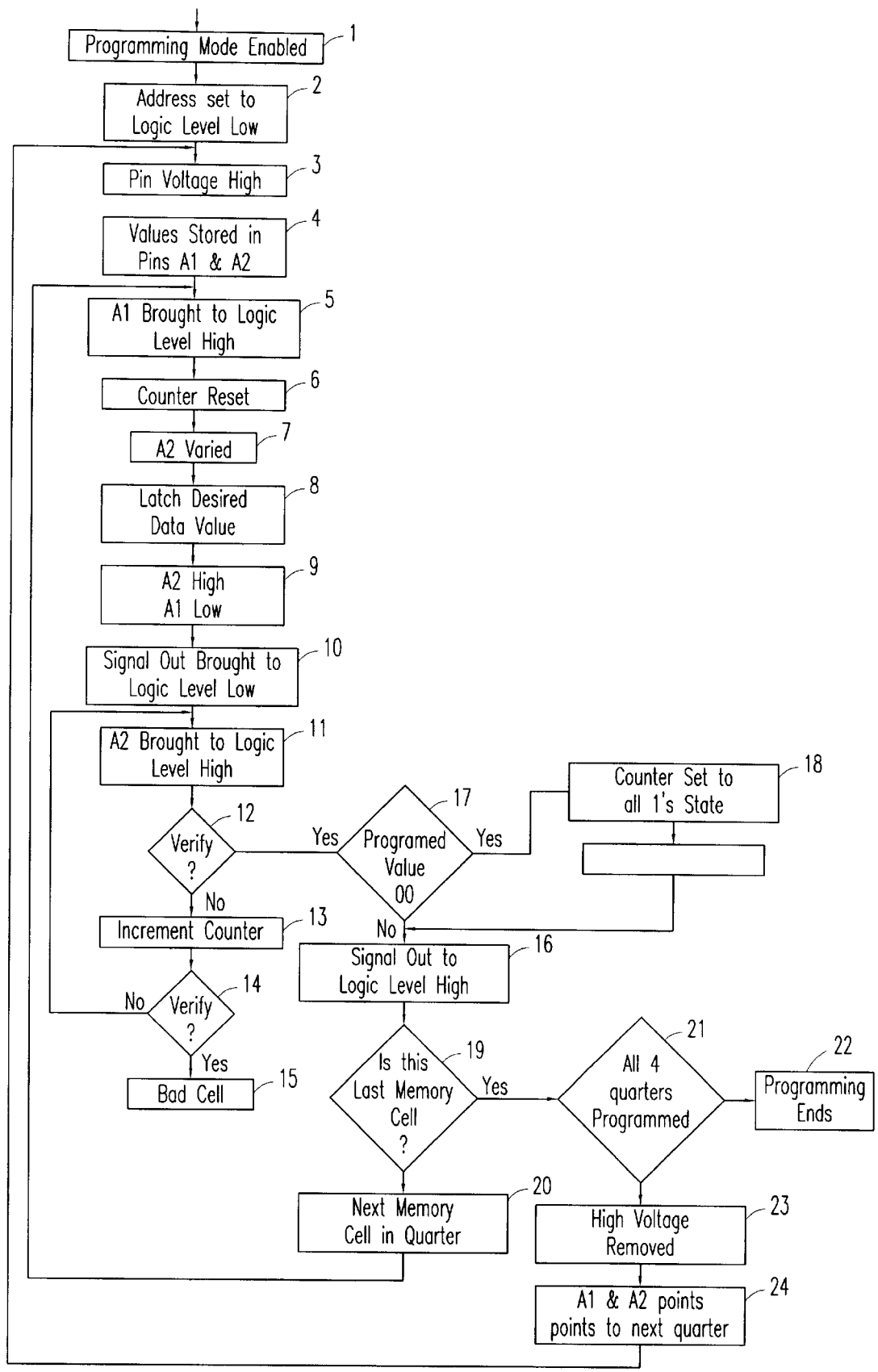
FIG. 5 is a flow diagram of a method for programming the multilevel nonvolatile memory of FIG. 1.

Referring now to FIG. 5, there is illustrated a flow diagram describing the method of programming a memory in accordance with the exemplary embodiment of the present invention. Initially, it is assumed that the programming of memory cells in memory device 50 will be controlled/synchronized by two address bits, A1 and A2. As a result, the programming of the memory cells in array 20 will occur in four sets of steps, with each set of steps corresponding to the programming of memory cells in a quarter of array 20. It is understood, however, that a different number of address pins may be used to control/synchronize programming operations, thereby resulting in the programming of the memory cells occurring in a number of sets of steps other than four.

The memory programming mode is enabled using a signal PGMODE at step 1. This step determines the active state of the memory by bringing a particular address of the memory to logic level high. Signal PGMODE may be, for example, the output of a latch controlled by address pins of memory device 50. The addresses are set to logic level low at step 2 to identify the first quarter of array 20, for example, and the supply voltage Vpp is raised to an elevated or high voltage at step 3 which stores in memory device 50 the value of the two address pins A1 and A2 at step 4. At this point, address pins A1 and A2 may be used to synchronize or otherwise control a programming operation.

The address pin A1 is brought to logic level high at step 5. Together with the supply voltage Vpp being at an elevated voltage, step 5 causes a signal A1TLDUMMY to be asserted and counter 52 to be reset at step 6. Step 7 performs the step of varying or transitioning the second synchronization address pin A2 so that the data to be programmed are latched in memory element 42 on the falling edge of address pin A2 at step 8. The second synchronization address pin A2 is then brought to the logic level high and functions hereafter as a clock, while the first synchronization address pin A1 is brought to logic level low at step 9. At this point, the preprogramming of memory device 50 is complete. In response to address pin A1 being in the logic low state at step 9, the output signal OUT in FIGS. 4a and 4b is brought to the logic level low at step 10, and this low logic level of the OUT signal is an indication to the programmer that the programming stage has begun. Steps 1–9 refer to the pre-programming steps in accordance with the exemplary embodiment of the present invention.

The programming steps to program an addressed memory cell includes two verification steps, steps 12 and 14. The actual programming begins with verification step 12, which checks to see if the memory cell is programmed to the desired value. If the verification step 12 provides a negative response, the counter 52 is incremented at step 13 (via the occurrence of a triggering edge on address pin A2) to apply a higher voltage to the addressed memory cell for application of a further programming interval on the addressed memory cell. Step 14 refers to the second verification step to determine if the memory cell has achieved its desired programming value. If the memory cell has not been programmed as desired, steps 12–13 are repeated. If after the second or other subsequent programming loop, the addressed memory cell has failed to be programmed, it is marked as a bad cell at step 15. However, if the verification step at 12 yielded a positive result, programming ends by bring to the logic level high the output signal OUT as illustrated in FIGS. 4a and 4b at step 16. The logic level high of the output signal OUT indicates the end of programming of the addressed memory cell.

If the desired programmed value is a 00 at step 17 (the data value loaded in step 8), the counter 52 is set to the all 1's state at step 18 and another programming interval on the addressed memory cell is performed. This provides a maximum voltage to the gate terminal of the memory cell during the additional programming interval. This additional programming step is performed to increase noise margin. This additional programming step is performed upon each block 38–40 completing the programming of its corresponding addressed memory cell. In particular, when an addressed memory cell has been fully programmed as desired, signal BLKPROGN of the corresponding block 38–40 is set to the low logic state. When all of the blocks 38–40 set their corresponding signals BLKPROGN to the logic low state, signal SETCOUNTER is set to the high logic state, which sets counter 52 to be in the all 1s state.

It is understood that steps 11–18 are performed for each addressed memory cell substantially simultaneously. In the case of memory device 50 having three blocks 38–40, steps 11–18 is performed on the three addressed memory cells at substantially the same time.

Step 19 checks to see if the previously programmed memory cell(s) is (are) the last memory cell(s) to be programmed in the addressed quarter of the array. If step 19 provides a negative result, the address is incremented to point to the next memory cell(s) in the quarter of the array to be programmed at step 20, after which steps 5–12 are repeated for programming the next memory cell(s) in the quarter. However, if all of the memory cells in the addressed quarter of the array have already been programmed, the method moves to step 21, which verifies/determines if the current address is the last address for programming (i.e., if the memory cells in all four quarters of the array 20 have been programmed). If a positive response is received at step 21, the programming cycle ends at step 22. However, if the current address at step 21 is not the last address for programming, the high voltage is removed from Vpp at step 23 and the first and second synchronization address pins A1 and A2 are changed at step 24 to point to the next quarter of the array 20 to be programmed. Step 24 takes the method back to step 3 and the steps as discussed above are repeated for programming the memory cells in the newly addressed quarter of the array 20.

Memory device 50 of the present invention advantageously provides effective synchronization during a programming operation by use of a relatively small number of address input pins and little circuit overhead, and without dedicated write/programming pins. Consequently, memory device 50 avoids the use of internal timing/clock circuitry that may vary considerably due to process dependencies.

Although preferred embodiments of the method and circuit of the present invention have been illustrated in the accompanying Drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A method for programming a multilevel nonvolatile memory, comprising the steps of:

comparing, using at least one address pin of the memory, a data value stored in an addressed memory cell to a desired data value; and applying, using the at least one address pin, program voltages to the addressed memory cell based upon the comparison.

2. The method of claim 1, further comprising:

repeating the steps of comparing and applying a plurality of times in order to program the addressed memory cell to the desired data value.

3. The method of claim 1, wherein the step of applying further comprises the step of:

selecting, using the at least one address pin, a voltage level from a plurality of predetermined voltage levels as at least one of the program voltages.

4. The method of claim 3, wherein:

the selected voltage level is greater than a previously selected voltage level applied to the addressed memory cell during the same programming operation.

5. The method of claim 1, wherein the at least one address pin performs synchronization during the comparing and applying steps.

6. The method of claim 1, further comprising:

initially latching the desired data value prior to the step of comparing.

7. The method of claim 1, further comprising:

prior to the step of comparing, temporarily storing an address value appearing on the at least one address pin; and following the step of temporarily storing, identifying the addressed memory cell using the temporarily stored address value.

8. The method of claim 1, wherein:

during the step of applying, the at least one address pin serves as a clock.

9. The method of claim 1, wherein:

the at least one address pin synchronizes the applying of the program voltages to the memory cell.

10. Circuitry for programming memory cells in a nonvolatile memory device, comprising:

a first circuit for generating a plurality of voltage levels; and a selection circuit for selecting any of the voltage levels to be applied to an addressed memory cell, the selection circuit being controlled by at least one address pin of the nonvolatile memory device.

11. The circuitry of claim 10, wherein the selection circuit comprises:

a multiplexer circuit having inputs for receiving the plurality of voltage levels; and a counter controlled by the at least one address pin, an output of the counter controlling the multiplexer circuit for selecting any of the plurality of voltage levels.

12. The circuitry of claim 11, wherein the at least one address pin is coupled to a clock input of the counter.

13. The circuitry of claim 1, wherein:

the at least one address pin comprises at least a first and a second address pin, the first address pin being coupled to a clock input of the counter and the second address pin being coupled to a reset input of the counter.

14. The circuitry of claim 11, wherein:

for each addressed memory cell, the counter is capable of counting each state of the counter, with each state selecting a different voltage level to be applied to the addressed memory cell.

15. The circuitry of claim 11, wherein the counter is clocked to select increasing voltage levels from the plurality of voltage levels.

16. The circuitry of claim 10, wherein:

a plurality of addressed memory cells are programmed substantially simultaneously, wherein the selection circuit provides the selected voltage level to each addressed memory cell.

17. The circuitry of claim 10, further comprising:

compare circuitry for comparing a data value stored in the addressed memory cell with a desired data value; and drive circuitry for selectively applying a program voltage to the addressed memory cell based upon the comparison, the program voltage being applied to the addressed memory cell substantially simultaneously with the selection circuit providing the selected voltage level thereto.

18. The circuitry of claim 17, wherein the drive circuitry comprises:

a sense amplifier connected to a drain terminal of the addressed memory cell; and a voltage source coupled to the sense amplifier and to the compare circuitry for selectively applying an elevated voltage as the program voltage.

19. The circuitry of claim 17, wherein:

the compare circuitry compares a plurality of data values stored in a plurality of addressed memory cells with a plurality of desired data values.

20. The circuitry of claim 19, wherein:

the compare circuitry selectively disables programming of the addressed memory cells individually while enabling programming of other of the addressed memory cells by the first circuit, the selection circuit and the drive circuitry.

21. The compare circuitry of claim 19, wherein:

the counter is selectively set based upon the data value to which the addressed memory cell is to be programmed.

22. A nonvolatile memory device, comprising:

at least one array of memory cells arranged into rows and columns;

address decode circuitry for receiving an externally-generated address and selecting a row and at least one column of memory cells corresponding thereto; and circuitry for programming a memory device, comprising:

a first circuit for generating a plurality of voltage levels; and a selection circuit for selecting any of the voltage levels to be applied to an addressed memory cell, the selection circuit being controlled by at least one address pin of the nonvolatile memory device.

23. The nonvolatile memory of claim 22, wherein the selection circuit comprises:

a multiplexer circuit having inputs for receiving the plurality of voltage levels; and a counter controlled by the at least one address pin, an output of the counter controlling the multiplexer circuit for selecting any of the plurality of voltage levels.

24. The nonvolatile memory of claim 23, wherein the at least one address pin is coupled to a clock input of the counter.

25. The nonvolatile memory of claim 23, wherein:

the at least one address pin comprises at least a first and a second address pin, the first address pin being coupled to a clock input of the counter and the second address pin being coupled to a reset input of the counter.

26. The nonvolatile memory of claim 23, wherein:

for each addressed memory cell, the counter is capable of counting each state of the counter, with each state selecting a different voltage level to be applied to the addressed memory cell.

* * * * *

UNITED STATES PATENT AND TRADEMARK OFFICE
CERTIFICATE OF CORRECTION

PATENT NO.    : 6,525,961 B2
DATED         : February 25, 2003
INVENTOR(S)   : Paolo Rolandi et al.

It is certified that error appears in the above-identified patent and that said Letters Patent is hereby corrected as shown below:

Column 1,
Line 43, replace "dependent and varies" with -- dependent and vary --

Column 5,
Line 64, replace "be in the all Is state." with -- be in the all 1s state. --

Column 7,
Line 32, replace "The circuitry of claim 1, wherein:" with -- The circuitry of claim 11, wherein: --

Signed and Sealed this

Twenty-seventh Day of January, 2004

JON W. DUDAS
*Acting Director of the United States Patent and Trademark Office*